United States Patent
Badami

(10) Patent No.: US 9,823,061 B2
(45) Date of Patent: Nov. 21, 2017

(54) DISPLACEMENT MEASUREMENT OF DEFORMABLE BODIES

(71) Applicant: Zygo Corporation, Middlefield, CT (US)

(72) Inventor: Vivek G. Badami, Higganum, CT (US)

(73) Assignee: Zygo Corporation, Middlefield, CT (US)

( * ) Notice: Subject to any disclaimer, the term of this patent is extended or adjusted under 35 U.S.C. 154(b) by 0 days.

(21) Appl. No.: 15/147,090

(22) Filed: May 5, 2016

(65) Prior Publication Data
US 2016/0363439 A1 Dec. 15, 2016

Related U.S. Application Data

(60) Provisional application No. 62/175,915, filed on Jun. 15, 2015.

(51) Int. Cl.
*G01B 11/14* (2006.01)
*G01B 11/16* (2006.01)

(52) U.S. Cl.
CPC .............. *G01B 11/16* (2013.01); *G01B 11/14* (2013.01)

(58) Field of Classification Search
CPC .......... G01B 11/16; G01B 11/14; G01B 9/02; G03F 7/20; G03F 9/7076; G03F 9/70; G03F 7/70633; G03F 9/00; G01D 5/38
See application file for complete search history.

(56) References Cited

U.S. PATENT DOCUMENTS

| | | | |
|---|---|---|---|
| 4,629,886 A | 12/1986 | Akiyama et al. | |
| 5,114,236 A * | 5/1992 | Matsugu | G03F 9/7076 250/548 |
| 5,400,145 A | 3/1995 | Suita et al. | |
| 5,407,763 A * | 4/1995 | Pai | G03F 9/70 356/401 |
| 5,827,629 A | 10/1998 | Miyatake | |
| 5,920,396 A | 7/1999 | Markoya et al. | |
| 8,300,233 B2 | 10/2012 | Deck et al. | |
| 8,988,690 B2 | 3/2015 | Deck et al. | |
| 9,025,161 B2 | 5/2015 | de Groot et al. | |
| 2009/0268210 A1 | 10/2009 | Prince | |
| 2011/0255096 A1* | 10/2011 | Deck | G01D 5/38 356/488 |

OTHER PUBLICATIONS

International Search Report and Written Opinion of the International Searching Authority for International Application No. PCT/US2016/030969 dated Aug. 12, 2016.
S. Y. Chou et al., "Imprint Lithography with 25-Nanometer Resolution", *Science*, vol. 272, pp. 85-87 (Apr. 5, 1996).
H. Schift, "Nanoimprint lithography: An old story in modern times? A review", *Journal of Vacuum Science & Technology*, B 26 (2), pp. 458-480 (Mar./Apr. 2008).
Taiwan Office Action for Taiwan Application No. 105114837 dated Jun. 8, 2017 (12 pages).

* cited by examiner

*Primary Examiner* — Tarifur Chowdhury
*Assistant Examiner* — Jamil Ahmed
(74) *Attorney, Agent, or Firm* — Fish & Richardson P.C.

(57) ABSTRACT

A method for measuring a position of an object, the method includes probing a sensing mark arranged in a first plane on a substrate to determine the position of the object, a portion of the substrate connecting the sensing mark to the object. An edge of the object can be sufficiently close to an edge of the sensing mark to reduce measurement errors in the position of the object caused by a deformation of the substrate.

19 Claims, 5 Drawing Sheets

DISPLACEMENT MEASUREMENT OF DEFORMABLE BODIES

CROSS-REFERENCE TO RELATED APPLICATIONS

This application claims the benefit of prior U.S. Provisional Application No. 62/175,915, filed on Jun. 15, 2016, which is incorporated in its entirety herein by reference.

BACKGROUND

The determination of displacements of an object is important in various applications, for example, in imprint lithography where various templates or masks are to be aligned to a previously imprinted pattern. Metrology systems used to determine displacements of such templates or masks often implicitly assume that the templates/masks or substrates holding the templates/masks are rigid. Such rigid body assumptions typically allow displacement measurements to be made at points remote from the point of interest. However, as discussed in "Soft UV Nanoimprint Lithography and Its Application," by Hongbo Lan in the book "Updates in Advanced Lithography," edited by Sumio Hosaka, deformation and distortion of soft thin film type molds used in sequential micro-contact and "peel-off" separation method can affect the resolution, uniformity and reproducibility of imprinted patterns. Similarly, Lazzarino et al. investigated mold deformation in nanoimprint lithography, as published in Journal of Vacuum Science & Technology B in 2004.

SUMMARY

The assumption that templates/masks or the substrates holding the templates/masks are rigid bodies is violated due to forces (e.g., in-plane and out-of-plane forces) that the mask experiences. For example, shear of fluids between the mask and the wafer during the alignment process can cause the mask substrate and/or the mask to deform. The breakdown of the rigid body assumptions causes errors in the measured displacements. In other words, displacement measurements made at the peripheral/edge of the mask substrate (i.e., far from the mask) do not represent the motions/displacements of the masks with high-fidelity.

Advantages of the methods and system disclosed herein include one or more of the following. By moving the point at which the metrology is performed close to the mask (or other regions of interest), effects of deformation of the structure between a measurement point and the region of interest can be minimized, improving the fidelity of the measurement. In this way, rigid body motions close to or around the region/point of interest (ROI/POI, respectively) can be more accurately determined. The deformation of the body in the region around the POI can also be determined. Sensing points that are sufficiently close to the ROI can minimize the Abbe offset between POI and the measurement points. A dimensionally-critical object can have its location and orientation measured and the effects of deformation are mitigated.

In one aspect, a method for measuring a position of an object, the method includes probing an sensing mark arranged in a first plane on a substrate to determine the position of the object, a portion of the substrate connecting the sensing mark to the object. An edge of the object can be sufficiently close to an edge of the sensing mark to reduce measurement errors in the position of the object caused by a deformation of the substrate.

Implementations can include one or more of the following features. The deformation can cause deviations in at least some positions within the substrate of 0.5 or more nanometers. The edge of the object can be sufficiently close to the edge of the sensing mark to reduce the measurement errors in the position of the object caused by the deformation of the substrate to less than 1 nm. The object can be less than 10 mm from the edge of the sensing mark. The edge of the object can be between 5-10 mm from an edge of the sensing mark. A surface of the object can be arranged in the first plane. The object can include a mask and the substrate can include a mask substrate. Probing the sensing mark can include sensing using a non-contact sensor. The non-contact sensor can sense light diffracted from the sensing mark. The method can include probing a second sensing mark using a second sensor, the non-contact sensor and the second sensor monitoring a corresponding one of the sensing marks in two or more degrees of freedom. The method can include positioning the mask above a previously imprinted pattern on a wafer based on the probing of the sensing mark. The sensing mark can be inscribed onto or attached to the first plane of the mask substrate, the first plane being a lower surface of the mask substrate, and the mask can be in direct contact with the lower surface of the mask substrate. The method can include probing a third sensing mark using a third sensor, the third sensor monitoring the third sensing mark in two or more degrees of freedom. Features of the sensing marks can be aligned with orthogonal measurement directions. The sensing mark can include a patterned structure and probing the sensing mark can include combining a first beam of light that diffracts from the sensing mark with a second beam of light to obtain an interference signal. Features of the sensing marks can be radially oriented. One degree of freedom can include a tangential direction relative to the sensing mark, the second sensing mark and the third sensing mark, each of the sensing marks can include a periodic structure, and probing the sensing mark can include combining a first beam of light that diffracts from the sensing mark with a second beam of light to obtain an interference signal. Probing the sensing mark can include sensing using a tactile sensor. The method can include measuring the deformation of the substrate in contact with the object. Measuring the deformation of the substrate can include monitoring an additional degree of freedom of the sensing mark by sensing light that has diffracted from a multidimensional pattern of the sensing mark. Measuring the deformation can contribute to determining a stretching of the substrate. A ratio of a distance from an edge of the object in the first plane to an edge of the sensing mark to a diameter of the substrate can be smaller than 3/50. The ratio can be between 3/100 and 3/50.

In another aspect, a system for measuring a position of an object, the system includes a sensing mark arranged in a first plane on a substrate, a portion of the substrate connecting the sensing mark to the object, and a sensor configured to probe the sensing mark. An edge of the object can be sufficiently close to an edge of the sensing mark to reduce measurement errors in the position of the object caused by a deformation of the substrate.

Implementations can include one or more of the following features. The deformation can cause deviations in at least some positions within the substrate of 0.5 or more nanometers. The edge of the object can be sufficiently close to the edge of the sensing mark to reduce the measurement errors in the position of the object by the deformation of the substrate to less than 1 nm. The object can be less than 10 mm from the edge of the sensing mark. The edge of the object can be between 5-10 mm from an edge of the sensing mark. The object can include a mask and the substrate can include a mask substrate. The sensing mark can be inscribed onto or attached to the first plane of the mask substrate, the first plane being a lower surface of the mask substrate, and the mask can be in direct contact with the lower surface of the mask substrate. The sensor can include a non-contact sensor. The sensor can be configured to sense light diffracted from the sensing mark, the sensing mark can include a patterned structure. The sensor can include optical elements and the optical elements can be configured so that during use of the system, a first beam of light that diffracts from the sensing mark is combined with a second beam of light to form an interference signal. The system can include a second sensing mark and a second sensor configured to probe the second sensing mark. The non-contact sensor and the second sensor can be configured to monitor a corresponding one of the sensing marks in two or more degrees of freedom. The system can include a third sensing mark and a third sensor configured to probe the third sensing mark.

Features of the sensing marks can be aligned with orthogonal measurement directions. Features of the sensing marks can be radially oriented. The sensing mark and the second sensing mark can include multidimensional patterns and the sensor can be configured to monitor an additional degree of freedom of the sensing mark based on light diffracted from the multidimensional patterns. The mask substrate can include a central region, a top surface, and a bottom surface, the mask can extend from the bottom surface of the mask substrate below the central region, and the sensing mark can be below the central region on the bottom surface of the mask substrate. The central region can be a circular region. The system can include optical elements to direct light from the sensing mark to the sensor.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
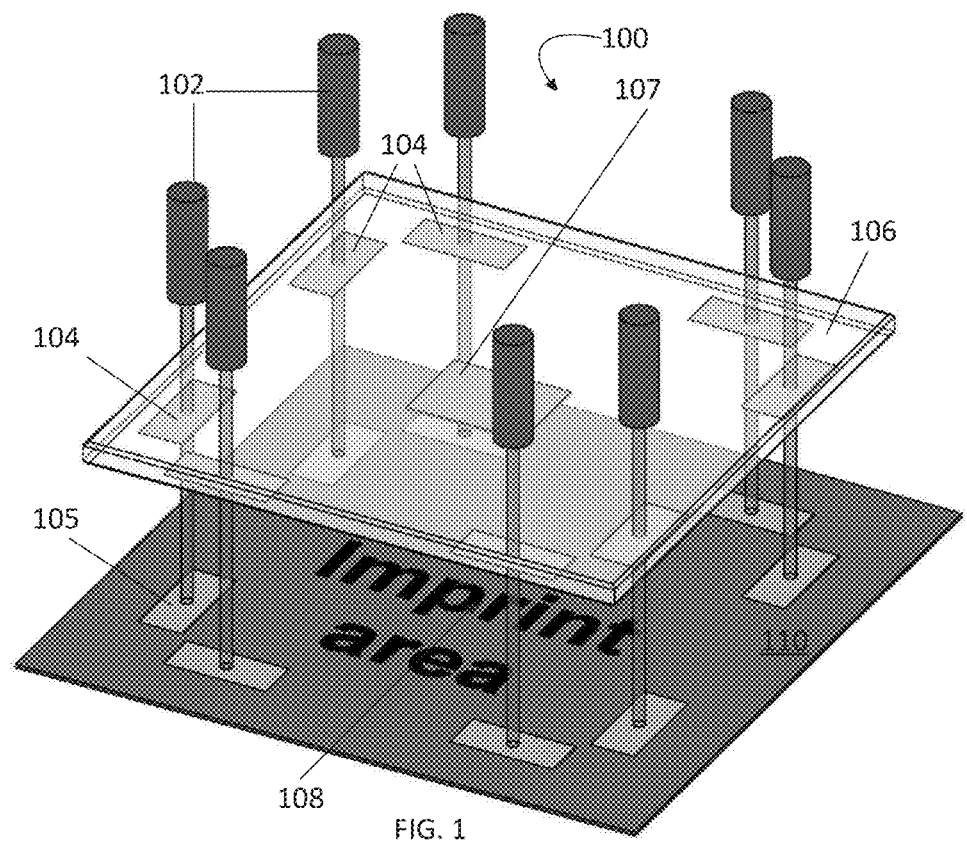
FIG. 1 is a system used to align two objects.

FIG. 1A shows a system 100 that can be used to position a first object, such as a mask substrate 106 bearing a mask 107, relative to a second object, as such a wafer 110. For example, the system 100 can be used to position the mask 106 relative to a localized region of the wafer 110, such as an imprint area 108. The imprint area 108 can be demarcated by a series of alignment marks 105. Corresponding alignment marks 104 are also located on the mask substrate 106. A device can be used to probe one or more alignment marks 104 and/or 105. For example, the device 102 can be a non-contact probe that emits light beams that are incident onto one or more alignment marks 104 and/or 105. Light from the device 102 can be incident on the alignment marks 104 of the mask substrate 106 and/or on the alignment marks 105 of the imprint area 108 on the wafer 110. The positioning of the first object relative to the second object can include measuring the displacement of the first object and/or the second object. In some embodiments, determining the position of the first object involves determining an absolute position of the first object and/or the second object.

Imprint lithography, in particular, nanoimprint lithography, a technique for producing nanoscale structures by creating replicas of a mask or a template in a polymer (such as a photoresist), is one application in which a position of a mask is determined relative to a wafer during the lithography process. Imprint lithography can involve dispensing (e.g., jetting, depositing) photoresist in a predetermined pattern onto a substrate (e.g., a wafer). Thereafter, a mask, bearing a pattern which can be defined as a series of cavities or voids in the surface and the body of the mask, is brought into contact with the photoresist layer. Pressure is applied to cause the photoresist to flow into the cavities in the mask. The photoresist is subsequently cured by exposing the photoresist to appropriate radiation (e.g., UV radiation) through the mask, causing the photoresist to polymerize and solidify. After the photoresist has solidified, the mask is separated from the substrate, leaving behind a series of structures on the substrate which is complementary to and a negative profile of the structures defined in the mask. The imprinting process can be repeated on the structured substrate using the same or a different mask for each successive layer of the desired pattern.

For example, a new layer of photoresist can be applied above the series of structures on the substrate, and a different mask can be brought into contact with the new layer of photoresist. Accurate alignment or registration between successive layers allows fine features between different layers to be aligned. In general, accurate alignment of the mask and the substrate (patterned or otherwise) to within nanometers (e.g., 10 nanometers or less, 5 nanometers or less, 1-4 nanometers) is desired. For imprinting applications, the mask can be directly fabricated onto, attached or otherwise fastened to a mask substrate to improve the ease of handling and positioning of the mask.

In some embodiments, a side of the mask substrate can be larger than 4 inches. For example, the mask substrate can be a 6 by 6 inch square. When alignment marks are arranged at a periphery of the mask substrate and the mask is positioned in the center of the mask substrate, far from the alignment marks, the validity of modeling the mask substrate as a rigid body determines the accuracy with which the position of the mask can be determined by measurements made at the periphery.

For example, the mask substrate may be deformable such that a displacement of the alignment marks at the periphery of the mask substrate by a unit distance can result in a displacement that is substantially more or less than the unit distance at the position of the mask. An object is deformable when a position within its body deviates by 0.5 or more nanometers from a position of that point in the body as predicted by a rigid body model. For example, deformation can cause at least some positions within the substrate, for example, a point distal to, or a point furthest away from an alignment mark to deviate by 0.5 or more nanometers (e.g., five or more nanometer, ten or more nanometers).

In the example of imprint lithography, during the process of aligning the mask to the substrate which are in contact via an intervening photoresist layer, fine adjustments of the position, orientation or scaling (magnification) of the mask (which is in contact with a fluid) relative to the substrate can generate sufficient forces and pressures to deform the mask substrate, for example, due to shear in the fluid. Alternatively, a temperature gradient in the mask substrate can also cause differential thermal expansion across the mask substrate. These deformations can include both in-plane and out-of-plane deformations of the mask substrate. For example, the stiffness of the mask substrate may be such that the mask substrate can deform under pressure. Such deformation can limit the resolution, uniformity and reproducibility of imprinted patterns. The dimensional stability of imprinted patterns may also be impacted due to applied pressure and thermal expansion.

Figure 2:
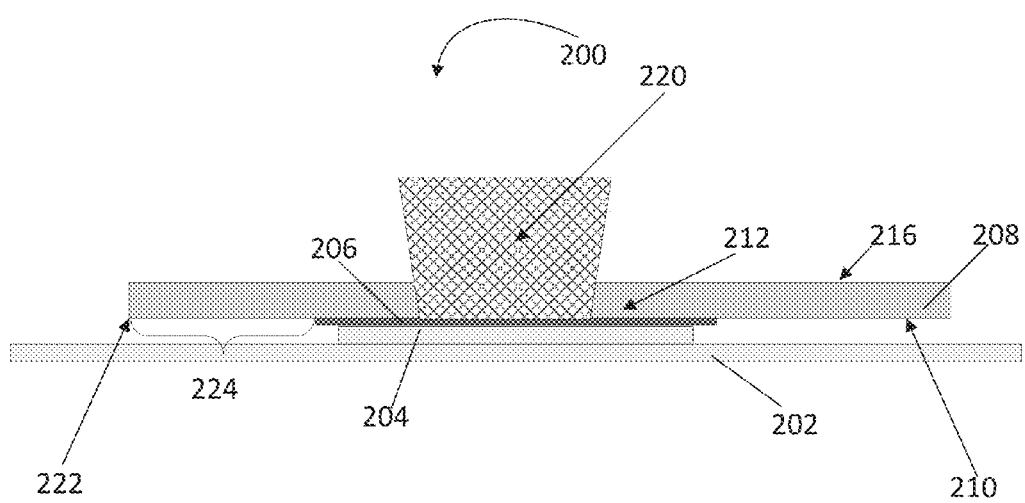
FIG. 2 shows a schematic cross sectional view of an imprint lithography system.

FIG. 2 shows a schematic side view of setup 200 used for imprint lithography. A wafer 202 supports, on its upper surface, a photoresist 204 in the vicinity of the mask 206. The photoresist 204 may not cover the whole mask. A lower surface of a mask 206 in turn contacts an upper surface of the photoresist 204. The mask 206 can be fabricated right onto the mask substrate 208, and can extend from a bottom surface 210 of the mask substrate 208. The thickness of the patterned region of the mask can be, for example, on the order of tens of microns. The mask substrate 208 has a central region 212. Illumination radiation 220, for example, in the shape of a cone or a cylinder, can illuminate the mask 206 through the mask substrate 208. While the mask substrate is shown as an element having a uniform thickness, the mask substrate can also be locally thinned (e.g., in the central region). Such local thinning can make the mask substrate even more susceptible to deformation.

When an alignment mark is located on the bottom surface 210 of the mask substrate at a position marked 222, a portion 224 of the mask substrate 208 connects the alignment mark to an edge of the mask 206. The portion 224 can also be referred to as a structural loop.

For a mask substrate that is a completely rigid body, a displacement of an alignment mark at a peripheral/edge region of the mask substrate by d from an initial position do would result in a corresponding displacement of the mask by d. However, when the mask substrate is not completely rigid, and a force is applied on it to position the mask at a desired position relative to a structured region on the wafer, the mask substrate can become deformed, such that a displacement of the alignment mark on the mask substrate by d no longer results in a corresponding displacement of the mask by d, but by a displacement of $d_1$. The difference between d and $d_1$ can be 0.5 or more nanometers. As a result of the deformability of the mask substrate, the mask cannot be definitively positioned to within a desired accuracy (e.g., better than 10 nm, better than 5 nm, better than 2 nm, better than 1 nm) from a desired location.

To account for the deformability of the substrate on which an alignment mark is placed, a sensing mark, which is also a point of measurement, is moved closer to the point of interest (POI). The POI can be a region on a mask substrate, and the point of measurement can provide sufficient information to extract displacements and rotations each in three degrees-of-freedom (DOF) (i.e., a total of six degrees of freedom). For example, by placing the sensing mark closer to the POI, measurement errors in the position of the mask by the deformation of the mask substrate is reduced to less than 10 nm, less than 5 nm, less than 2 nm, or less than 1 nm.

Figure 3:
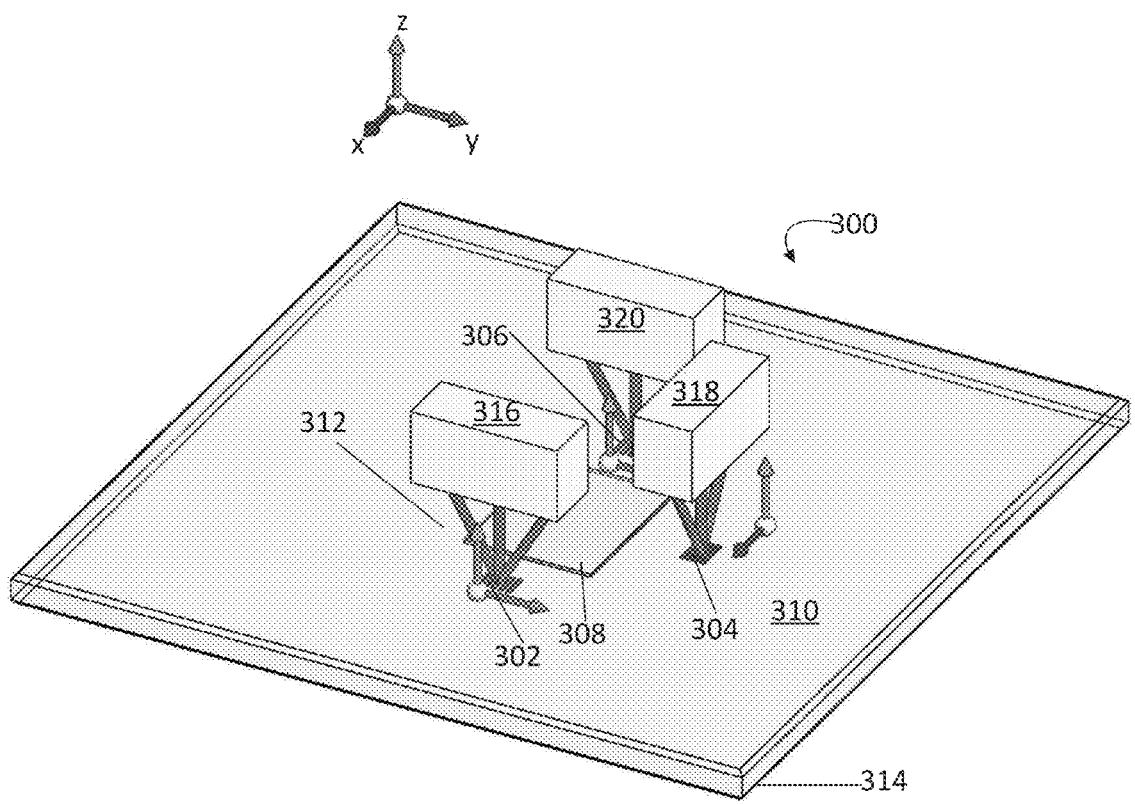
FIG. 3 shows a schematic of a measurement system.

FIG. 3 shows a schematic diagram of a measurement setup 300 that includes three sensing marks 302, 304, and 306, all of which are positioned sufficiently close to a mask 308 to reduce (e.g., eliminate) displacement errors caused by a deformation of the mask substrate 310. Each of the three sensing marks 302, 304, and 306 can be positioned on a bottom surface 314 of the mask substrate 310, directly under the central region 312. The mask 308 is fabricated into the mask substrate and extends from the bottom surface 314 of the mask substrate. In this way, each of the sensing marks is in the same plane and in close proximity to the mask 308.

The sensing marks 302, 304, and 306 can each be in the form of a patterned structure. The patterned structure can be a pattern (structured or otherwise), e.g., a series of lines that is fabricated or inscribed directly on a surface or within the bulk of the mask substrate 310. The pattern can be either periodic, or non-periodic. Alternatively, the pattern structure can be separately fabricated before being attached to the mask substrate. For example, the sensing mark 302 can include a series of lines that extends in the x-y plane, parallel to the x direction. The light incident on the sensing mark 302 can be emitted by a sensor 316 which can also detect the light after it has interacted with the sensing mark. The sensor/read head 316 can be an interferometric encoder system, such as those described in U.S. Pat. No. 8,300,233, entitled "Interferometric Encoder Systems," the content of which is incorporated herein by reference in its entirety. The orthogonal arrows pointing away from the sensing mark 302 depict the two measured DOF (i.e., z and y) for which information can be extracted from light diffracted by the sensing mark 302. For example, the interferometric encoder system can cause a first beam of light that diffracts from the sensing mark to be combined with a second beam of light to form an interference signal.

In the setup 300, the three sensing marks 302, 304, and 306 are oriented to form an orthogonal arrangement of sensing directions. In other words, the series of parallel lines in each of the sensing marks align with either the x or the y directions. Each sensor (or read head) provides displacement information in two DOF, i.e., in one in-plane direction (x or y) and in one direction perpendicular to the plane of the mask (z). In combination, the three sensors 316, 318, and 320 provide displacement and rotation information for all six DOF. Measurements of all six DOF (particularly those in the x-y plane) are expected to have much higher fidelity due to the significantly shorter structural loop (i.e., the portion of the mask substrate 310 that connects each of the sensing marks to an edge of the mask) that results from moving the sensing marks/measurement points much closer to the mask 308, the POI. In this way, the distance and deformation between the measurement point and the POI is reduced in the x-y plane. In other words, intervening non-rigid material between the measurement point and the POI is minimized.

Moreover, because the sensing marks 302, 304, and 306 are arranged on the bottom surface of the mask substrate 310 (instead of an upper surface, such as the upper surface 216 of the central region shown in FIG. 2), Abbe offsets in the z-direction are minimized, thereby minimizing the errors due to angular rigid body motions and angular deformations about the x and y directions.

Figure 4:
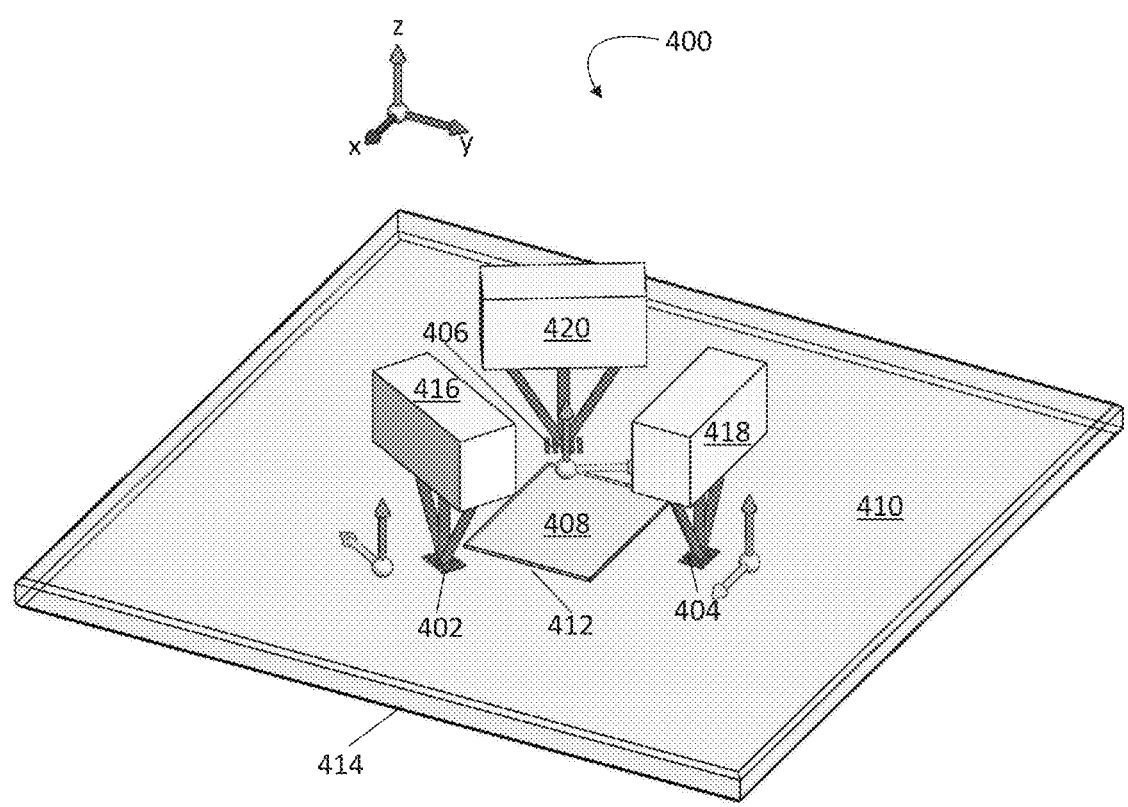
FIG. 4 shows a schematic of a measurement system.

FIG. 4 shows another configuration of a measurement system 400 in which sensing marks 402, 404, and 406 are arranged such that each sensor or read head (416, 418, and 420) associated with each sensing mark senses in two DOF—one in an in-plane (x-y plane) tangential direction and one in an out-of-plane (z) direction. The tangential measurement DOF is tangential, for example, to a circle circumscribed by the three sensing marks 402, 404, and 406, or a circle in the x-y plane (i.e., mask plane) centered about the mask. For example, the series of lines in the sensing marks can be oriented radially, for example, with respect to the central region 412.

In both the embodiments shown in FIGS. 3 and 4, the sensing marks are close to the masks, such that an edge of the sensing marks is less than 10 mm from an edge of the mask (e.g., between 5-10 mm). Alternatively, the proximity of the sensing marks to the edge of the mask can be expressed as a ratio of the distance (e.g., smallest distance) between an edge of the sensing mark and the edge of the mask to a diameter of the mask substrate. When the mask substrate is not circular, the diameter of the mask substrate can refer to the longest length, or a diagonal of the mask substrate. The ratio can be less than 3/50 (e.g., less than 5/100, less than 3/100, less than 2/100, less than 1/100). The diameter of the mask substrate can be about 8.5 inches. A factor affecting how close the alignment mask can be to the mask is the size of the illumination beam (depicted as illumination beam 220 in FIG. 2). The sensing marks and all sensors can be positioned outside of the illumination beam 220.

Figure 5:
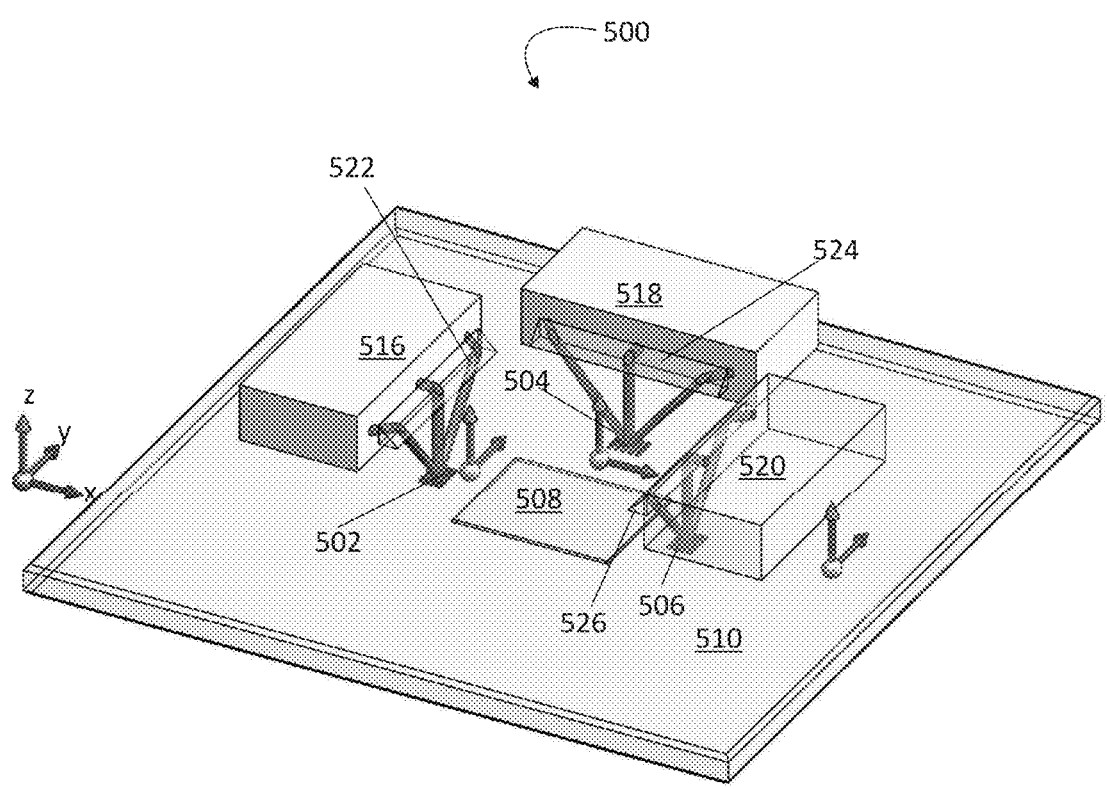
FIG. 5 shows a schematic of a measurement system.

FIG. 5 shows a measurement system 500, which modifies the measurement system 300 shown in FIG. 3, by incorporating features that help to keep the central aperture unobscured, such as folding the optical beam paths of the light used for metrology and reducing the size of the sensors/read head in the z-direction. For example, each of sensor/read head 516, 518, and 520 can be smaller in the z-direction compared to the sensor/read head 316, 318 and 320. Prisms 522, 524, and 526 (or a mirror), each having a surface at which light emitted from the sensor and/or received from a respective one of sensing marks 502, 504, and 506 can be reflected (e.g., reflected or totally internally reflected) to redirect measurement light away from the central region. The sensor head 520 has been rendered transparent to more clearly show sensing mark 506 and the prism 526. A similarly folded version can also be implemented for the measurement system 400 shown in FIG. 4.

Figure 6:
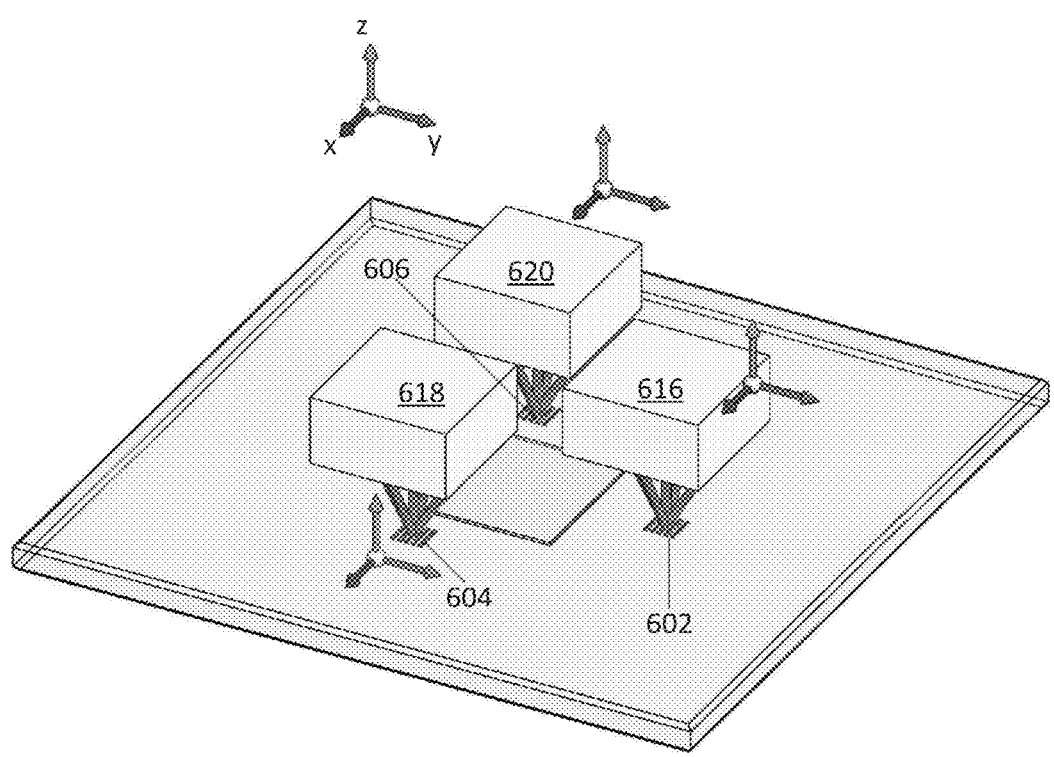
FIG. 6 shows a schematic of a measurement system.

Instead of using a series of lines as the periodic pattern in the sensing mark, the use of multidimensional patterns, such as checkerboard sensing marks 602, 604 and 606 shown in FIG. 6 can allow each sensor/read head 616, 618, and 620 to collect information in three degrees of freedom, resulting in a total of nine degrees of freedom for the three sensing marks. The additionally measured DOFs enable the measurement of the deformation, e.g., stretching of the pattern to set magnifications.

The sensors/read heads can also be tactile sensors such as linear variable differential transformer (LVDT), linear variable differential inductor (LVDI) gages and other devices sensitive to position and displacement. In addition, the displacement can also be sensed by other non-contact sensors such as laser displacement gages, triangulation sensors, confocal sensors, fiber sensors, capacitance gages and other devices sensitive to position and displacement.

The invention and embodiments described herein are not limited to deformations that arise in the context of imprint lithography. For example, they can be applied to any situation in which a sensing mark is probed to determine the position of an object and assumptions regarding rigid-body motions break down. Additional embodiments include addressing deformations that arise in the context of projection lithography (e.g., deformation of a mask substrate or a wafer).

Additional embodiments are within the scope of the following claims.

What is claimed is:

1. A method for measuring a position of an object, the method comprising:
   probing a sensing mark arranged in a first plane on a substrate to determine the position of the object, a portion of the substrate connecting the sensing mark to the object;
   wherein an edge of the object is sufficiently close to an edge of the sensing mark to reduce measurement errors in the position of the object caused by a deformation of the substrate to less than 1 nm.

2. The method of claim 1, wherein the deformation causes deviations in at least some positions within the substrate of 0.5 or more nanometers (nm).

3. The method of claim 1, wherein the object is less than 10 millimeters (mm) from the edge of the sensing mark.

4. The method of claim 1, wherein a surface of the object is arranged in the first plane.

5. The method of claim 1, wherein the object comprises a mask and the substrate comprises a mask substrate.

6. The method of claim 5, wherein probing the sensing mark comprises sensing using a non-contact sensor.

7. The method of claim 6, wherein the non-contact sensor senses light diffracted from the sensing mark.

8. The method of claim 7, further comprising probing a second sensing mark using a second sensor, the non-contact sensor and the second sensor monitoring a corresponding one of the sensing marks in two or more degrees of freedom.

9. The method of claim 6, further comprising positioning the mask above a previously imprinted pattern on a wafer based on the probing of the sensing mark.

10. The method of claim 6, wherein the sensing mark is inscribed onto or attached to the first plane of the mask substrate, the first plane being a lower surface of the mask substrate, and the mask being in direct contact with the lower surface of the mask substrate.

11. The method of claim 8, further comprising probing a third sensing mark using a third sensor, the third sensor monitoring the third sensing mark in two or more degrees of freedom.

12. The method of claim 11, wherein the sensing mark comprises a patterned structure and probing the sensing mark comprises combining a first beam of light that diffracts from the sensing mark with a second beam of light to obtain an interference signal.

13. The method of claim 11, wherein features of the sensing marks are radially oriented.

14. The method of claim 12, wherein one degree of freedom comprises a tangential direction relative to a circle centered about the mask in a plane of the mask, each of the sensing marks comprises a patterned structure, and probing the sensing mark comprises combining a first beam of light that diffracts from the sensing mark with a second beam of light to obtain an interference signal.

15. The method of claim 1, further comprising measuring the deformation of the substrate in contact with the object.

16. The method of claim 15, wherein measuring the deformation of the substrate comprises monitoring an additional degree of freedom of the sensing mark by sensing light that has diffracted from a multidimensional pattern of the sensing mark.

17. The method of claim 15, wherein measuring the deformation contributes to determining a stretching of the substrate.

18. A method for measuring a position of an object, the method comprising:
   probing a sensing mark arranged in a first plane on a substrate to determine the position of the object, a portion of the substrate connecting the sensing mark to the object;

wherein an edge of the object is sufficiently close to an edge of the sensing mark to reduce measurement errors in the position of the object caused by a deformation of the substrate, and a ratio of a distance from an edge of the object in the first plane to an edge of the sensing mark to a diameter of the substrate is smaller than 3/50.

19. The method of claim 18, wherein the ratio is between 1/100 and 3/50.

\* \* \* \* \*

UNITED STATES PATENT AND TRADEMARK OFFICE
CERTIFICATE OF CORRECTION

PATENT NO. : 9,823,061 B2
APPLICATION NO. : 15/147090
DATED : November 21, 2017
INVENTOR(S) : Vivek G. Badami Page 1 of 1

It is certified that error appears in the above-identified patent and that said Letters Patent is hereby corrected as shown below:

In the Specification

Column 1
Line 8 (Approx.), delete "2016" and insert -- 2015 --

Signed and Sealed this
Twenty-second Day of May, 2018

Andrei Iancu
*Director of the United States Patent and Trademark Office*